United States Patent [19]

Votruba et al.

[11] Patent Number: 4,887,038

[45] Date of Patent: Dec. 12, 1989

[54] SOLENOIDAL SURFACE COILS FOR MAGNETIC RESONANCE IMAGING

[75] Inventors: Jan Votruba, Port Jefferson; George R. Morris, Bay Shore, both of N.Y.

[73] Assignee: Fonar Corporation, Melville, N.Y.

[21] Appl. No.: 257,399

[22] Filed: Oct. 13, 1988

Related U.S. Application Data

[63] Continuation-in-part of Ser. No. 125,331, Nov. 25, 1987, abandoned.

[51] Int. Cl.⁴ ............................................. G01R 33/20
[52] U.S. Cl. .................................... 324/318; 324/300
[58] Field of Search ............... 324/300, 307, 309, 318, 324/319, 322; 128/653

[56] References Cited

U.S. PATENT DOCUMENTS 4,398,149  8/1983  Zens ..................................... 324/319
4,791,372  12/1988  Kirk et al. ........................... 324/318
4,793,356  12/1988  Misic et al. ......................... 324/318

FOREIGN PATENT DOCUMENTS 61-59806  3/1986  Japan ................................... 324/307

*Primary Examiner*—Stewart J. Levy
*Assistant Examiner*—Kevin D. O'Shea
*Attorney, Agent, or Firm*—Lerner, David, Littenberg, Krumholz & Mentlik

[57] ABSTRACT

Receiver coil for use with a Nuclear Magnetic Resonance Imaging (NMRI) instrument includes a flexible electrical conductor formed from a multiplicity of conductor strips connected in parallel and carried by a flexible insulator. The insulator is configured to be wrapped around an object to be imaged to form the conductor into a coil whose interior is substantially occupied by the object. Air vents may also be provided to improve the ventilation of air through the receiver coil in its wrapped configuration and to reduce any claustrophobic discomfort of a patient.

18 Claims, 3 Drawing Sheets

SOLENOIDAL SURFACE COILS FOR MAGNETIC RESONANCE IMAGING

CROSS-REFERENCE TO RELATED APPLICATION

This application is a continuation-in-part application of U.S. application Ser. No. 125,331 filed Nov. 25, 1987, now abandoned.

BACKGROUND OF THE INVENTION

1. Field of the Invention

The present invention pertains to receiver coils and, in particular, to receiver coils used in conjunction with a Nuclear Magnetic Resonance Imaging instrument.

2. Description of the Prior Art

Nuclear Magnetic Resonance Imaging (NMRI) instruments are used today in a wide variety of analytical and diagnostic applications. An object to be analyzed in an NMRI instrument is positioned within a strong magnetic field. A transmitter, in the form of a coil, is connected to a source of radio frequency (RF) energy and, in response thereto, the transmitter coil irradiates the object with an alternating magnetic field. Constituents of the object absorb energy from the alternating magnetic field and, as a result, certain energy levels of the constituents are excited. That is, selected nuclei are energized from their equilibrium states to higher energy states.

Subsequently, the constituents return to their initial, lower energy level by radiating some of the absorbed energy. This radiated energy is detected by a receiver coil. Finally, standard, well-known Nuclear Magnetic Resonance (NMR) techniques ar used to analyze the signals produced by the receiver coils. Such standard, well-known NMR techniques are disclosed in a number of references, for example: an article entitled "Medical Imaging by NMR" by P. Mansfield and A. A. Maudsley, *British Journal of Radiology*, Vol. 50, pp. 188–194 (1977); an article entitled "Image Formation by Nuclear Magnetic Resonance: The Sensitive-Point Method" by W. S. Hinshaw, *Journal of Applied Physics*, Vol. 47, No. 8, Aug. 1976; U.S. Pat. No. 4,015,196 issued to Moore et al.; and U.S. Pat. No. 3,932,305 issued to Abe et al.

The receiver coil in a typical NMRI instrument that is designed for providing images of humans of medical purposes is necessarily large in order to accommodate an entire human body. For example, see U.S. Pat. Nos. 4,354,499 and 4,411,270 both of which were issued to Damadian. However, such large receiver coils pose a problem when a smaller object such as, for example, a human neck, a joint, a limb, and so forth, is analyzed. Such small objects fill only a portion of the volume of larger receiver coils, thus resulting in a diminished signal-to-noise ratio.

Thus, there is a need in the art for receiver coils used in conjunction with NMRI instruments for analyzing relatively small objects such as the human head which provide substantially uniform sensitivity and high signal-to-noise ratios.

SUMMARY OF THE INVENTION

Embodiments of the present invention are receiver coils used in conjunction with NMRI instruments which are adapted to closely conform to variously sized objects being analyzed and to provide uniform sensitivity and high signal-to-noise ratios. More specifically, an embodiment of the receiver coil comprises a flexible, electrical conductor and a flexible insulator which carries the electrical conductor. The flexible insulator is adapted to be wrapped around the object to be analyzed and, thereby, to shape the flexible, electrical conductor into a coil which surrounds an interior volume which is substantially occupied by the object. Because the interior volume within the inventive receiver coil is substantially filled, the quality of the NMR images obtained will be substantially improved.

In one embodiment of the present invention, the flexible insulator includes a relatively thin, fiberglass belt having a substantially rectangular shape. The flexible, electrical conductor comprises a multiplicity of electrically conductive strips which are connected in parallel and obliquely carried by the belt such that the electrical conductor generally extends longitudinally from one side of the belt to the opposite side of the belt. As a result, when the belt is wrapped around an object, the electrical conductor forms a receiver coil comprised of a plurality of non-overlapping, non-interfering turns. Such a configuration minimizes stray capacitance and, thereby, improves the quality of the NMR images.

In another embodiment of the present invention, the flexible insulator includes a relatively thin, fiberglass belt having a substantially rectangular shape. The flexible, electrical conductor generally extends longitudinally from one side of the belt to an opposite side of the belt and comprises at least two sections of a multiplicity of electrically conductive strips which are connected in parallel, the sections of strips being offset from each other. As a result, when the belt is wrapped around an object, the electrical conductor forms a receiver coil comprised of a plurality of non-overlapping, non-interfering turns. Such a configuration minimizes stray capacitance and, thereby, improves the quality of the NMR images.

In yet another embodiment of the present invention, portions of the flexible insulator and/or carrier are removed to improve ventilation for a patient having the belt wrapped about his head. This configuration also serves to reduce the claustrophobic effect of the head coil. Both of these features enable longer periods of imaging which are often required when using NMR techniques.

Another aspect of this embodiment provides a plastic insulator on the lower portion of the head coil, leaving the conductors to surround a patient's face at the upper portion of the head coil independently of any insulating material. Of course, the conductors at the upper portion of the head coil can be shaped to match the contour of a patient's head.

BRIEF DESCRIPTION OF THE DRAWING

The principles of the present invention may be clearly understood by considering the following detailed description in conjunction with the accompanying drawing, in which.

To facilitate understanding, identical reference numerals have been used to denote identical elements common to the figures.

DETAILED DESCRIPTION

Figure 1:
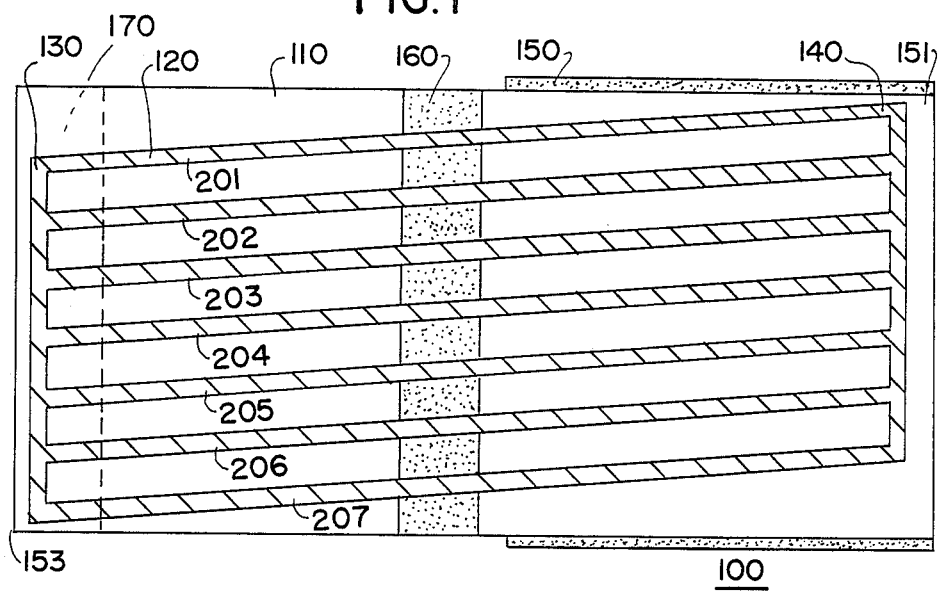
FIG. 1 shows a plan view of a receiver made in accordance with a first embodiment of the present invention.

FIG. 1 shows a first embodiment of the present invention, namely, receiver 100 Receiver 100 can be configured, as will be explained in detail below, to form a receiver coil which closely conforms to a portion of a human body, such as, for example, a human head, undergoing Nuclear Magnetic Resonance Imaging.

Receiver 100 includes belt 110 comprised of an insulator such as, for example, fiberglass. A common fiberglass material known as G10 having a thickness of twenty mils may be used to form belt 110. Fiberglass is a preferred insulator for use in fabricating embodiments of the present invention because it is not excessively stretchable or bendable. As a result, a belt fabricated from fiberglass will substantially retain its shape whenever it is wrapped about an object to be analyzed in the manner to be described below.

Belt 110 carries flexible, electrical conductor 120 on one surface thereof. As shown in FIG. 1, conductor 120 comprises several, electrically connected, substantially parallel strips 201 to 207 which extend longitudinally from end 151 of belt 110 to opposite end 153 of belt 110 in a substantially oblique relationship with respect to ends 151 and 153. In a preferred embodiment, conductor 120 is formed from copper strips which are approximately 5 mils thick and approximately ¼" wide. Conductor 120 may be covered by a sleeve (not shown) or, in a further embodiment, carried within insulator belt 110 In fact, in preferred embodiments of the present invention, insulator belt 110 forms a sandwich structure with conductor 120 being disposed in the middle of the sandwich structure. A sandwich structure forms a preferred embodiment of belt 110 because a sandwich structure will provide enough mechanical support for conductor 120 that it will not break when flexed.

Electrical conductive strips or leads 130 and 140 are connected to opposite ends of conductor 120. For example, lead 130 is connected to the portion of conductor 120 that is adjacent end 153 of belt 110 and lead 140 is connected to the portion of conductor 120 that is adjacent end 151 of belt 110. Leads 130 and 140 are used to apply signals which are produced in conductor 120 as input into an NMRI instrument (not shown).

Belt 110 additionally carries a spacer pad 150 on the surface which is opposite the surface which carries conductor 120. Spacer pad 150 is preferably an approximately ¾" thick piece of foam. Affixing means 160 is affixed to the same surface of belt 110 that carries conductor 120 and affixing means 170 is affixed to the same surface of belt 110 that carries spacer pad 150. As shown in FIG. 1, affixing means 160 is preferably disposed substantially adjacent space pad 150 and affixing means 170 is preferably disposed substantially adjacent to end 153 of belt 110 Further, in a preferred embodiment, affixing means 160 comprises Velcro hooks and affixing means 170 comprises Velcro loops or vice versa.

Figure 2:
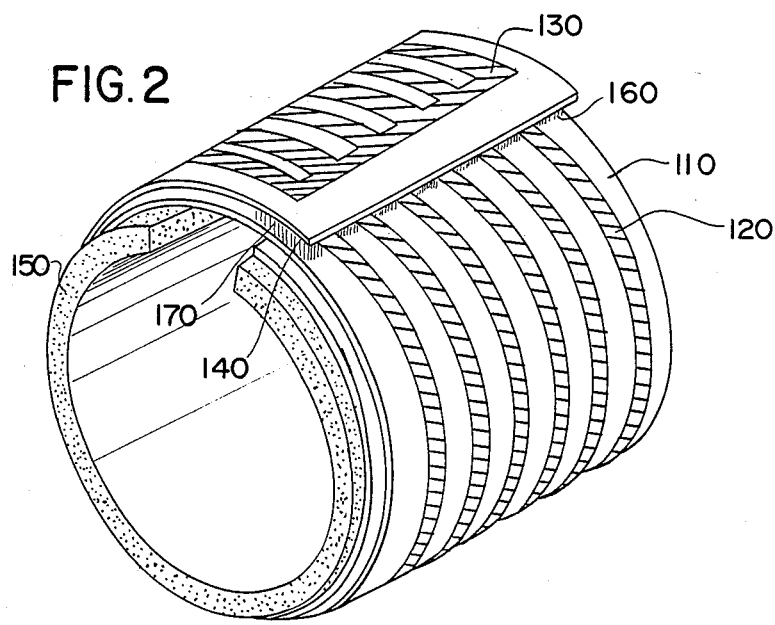
FIG. 2 shows a perspective view of the receiver shown in FIG. 1, wherein the coil is configured to form a coil for use in conjunction with an NMR imaging instrument.

FIG. 2 shows how the embodiment of the present invention shown in FIG. 1 is configured to form a coil for use in conjunction with an NMRI instrument. This embodiment of receiver 100 is configured for use by wrapping it around an object to be analyzed, for example, a human head. The use of a relatively inflexible insulator such as G10 fiberglass causes a cross-section of the volume enclosed by belt 110 to be substantially circular. Spacer foam pad 150 is sufficiently long that it forms a single loop around the object when belt 110 is wrapped therearound, i.e., the length of foam pad 150 extending from end 151 towards end 153 of belt 110 should be substantially equal to the circumference of the outer surface of the object to be analyzed. As will be described in more detail below, foam pad 150 serves to provide a space between the object, for example, the head, and conductor 120. This space advantageously decreases capacitive coupling between the object and conductor 120 and, thereby, improves the signal-to-noise ratio. In addition, foam pad 150 increases patient comfort when his head is disposed within the volume encompassed by belt 110.

Velcro hooks 160 and Velcro loops 170 are positioned so that they cooperate to hold belt 110 in its "wrapped" configuration when belt 110 is wrapped around the object. Although we have shown affixing means 160 and 170 to comprise Velcro hooks and loops, respectively, it is within the spirit of the present invention that any other suitable affixing means may be provided for maintaining belt 110 in its "wrapped" configuration. For example, one could apply clips to hold belt 110 in this configuration.

Conductor 120 is carried by belt 110 according to a predetermined relationship such that when belt 110 is wrapped around the object, conductor 120 forms a receiver coil which is custom fit to the object and which has a shape that is responsive to the predetermined relationship. Preferably, belt 110 is custom fit to the object in such a fashion the volume enclosed thereby is substantially occupied by the object. Further, the angle that strips 201 to 207 of conductor 120 make with respect to end 151 of belt 110 and the spacing between strips 201 to 207 are sufficiently large that conductor 120 forms a receiver coil comprised of a plurality of substantially non-overlapping turns when belt 110 is wrapped around an object in the manner shown in FIG. 2. For this reason, when belt 110 is configured in the manner shown in FIG. 2, conductor 120 forms a receiver coil which is capable of producing a high sensitivity signal which is suitable for input to an NMRI instrument and which provides a high signal-to-noise ratio.

We will now describe how embodiments of the present invention provide receiver coils having an improved signal-to-noise ratio and uniform sensitivity.

SIGNAL-TO-NOISE RATIO

A receiver coil used in conjunction with an NMRI instrument is a passive rf antenna. In essence, the signal-to-noise ratio of detected signal from the receiver coil is substantially proportional to:

$$[Q_{circuit} (Vol_{obj}/Vol_{coil})]^{178} \qquad (1)$$

where $Q_{circuit}$ is the Q of the circuit in which the receiver coil is a component, $Vol_{obj}$ is the volume of the object to be analyzed, and $Vol_{coil}$ is the volume enclosed by the receiver coil. Further, $Vol_{obj}/Vol_{coil}$ is referred to as a filling factor of the receiver coil. The filling factor of a receiver coil is the ratio of the volume of the object divided by the volume enclosed by the coil, for example, the volume enclosed by the coil in FIG. 2 is the space denoted as 200. In practice, it is detrimental to try to make the filling factor large by configuring the receiver coil to be very close to the object. Even though the filling factor will be made large thereby, such a configuration is detrimental because the stray capacitance between the coil and the object to be analyzed. This increased stray capacitance will cause a degradation of the Q of the circuit by reason of dielectric losses and resistive losses in the object.

Stray capacitance is inversely proportional to the distance between the receiver coil and the object, i.e., the longer the distance, the lower the stray capacitance. Thus, foam pad 150 lines belt 110 and acts as a spacer to ensure that an object is disposed at a substantially optimum distance from the receiver coil so that stray capacitance is not too great and that the filling factor is not too small. It is thus advantageous to wrap belt 110 with spacer foam pad 150 tightly around the object to achieve a reasonably high filling factor.

SENSITIVITY

The sensitivity of a receiver coil, in general, is proportional to the electromotive force induced in the coil. The electromotive force, in turn, is proportional to the magnetic field induced in the receiver coil by currents circulating therein multiplied by the magnetization of the object. Since more lines of force from an object cross a receiver coil when the object is closer to the receiver coil than when it is farther away, the receiver coil is more sensitive when it is closer to the object.

Further, where the object to be imaged is of uneven contour thereby resulting in greater distances between the coil and the object in areas of such uneven contour, the sensitivity of the receiver coil will also vary. Thus, the signal-to-noise ratio of the received signals will vary for different portions of the object. This signal-to-noise variation is mitigated in accordance with the present invention because the receiving coil herein provides a substantially uniform magnetic field in the volume enclosed thereby. This further ensures that the sensitivity of the receiver coil will be uniform over the object. For these reasons, the embodiment shown in FIG. 1, comprises several conductive strips for each circumferential wrapping turn about the object to be analyzed. Thus, each turn of the coil is wide to provide a substantially uniform magnetic field throughout the volume encompassed by the coil. Still further, because of the angle which the strips make with respect to end 151 of belt 110, the strips do not overlap when the receiver coil is configured in the form shown in FIG. 2. A further advantage that results by reason of the non-overlapping configuration is a greatly reduced mutual capacitance between the strips.

The embodiment of receiver coil 100 shown in FIG. 1 is advantageous for another reason. The circuit in which receiver coil 100 forms an element has a resonance frequency which is essentially given by:

$$f_{res} = [L_{coil}(C_T + C_S)]^{-\frac{1}{2}} \quad (2)$$

where $L_{coil}$ is the inductance of the receiver coil, $C_S$ is the stray capacitance of the circuit, and $C_T$ is a tuning capacitor. For a typical NMRI instrument, $f_{res}$ is in the range of 12 to 14 MHz. In order to mitigate the detuning effects of the essentially unknown value of the stray capacitance, it is advantageous to utilize a circuit where $C_T$ is much greater than $C_S$. Thus, $L_{coil}$ should be low enough to satisfy the frequency relationship of equation (2) when using a relatively large value of $C_T$. As a consequence, since the inductance of a coil is directly proportional to the square of the number of turns, one must keep the number of turns sufficiently low to satisfy equation (2) so as to allow $C_T$ to be much larger than $C_S$ thereby reducing the detuning effect of the tray capacitance. The embodiments of the present invention advantageously meet the above-described requirements and provide a substantially uniform magnetic field in the volume enclosed by the receiver coil by having each turn comprise a multiplicity of conductive strips. As shown in FIG. 1, a preferred embodiment of the present invention includes receiver coil 100 wherein each turn of receiver coil 100 comprises seven (7) conductive strips 201 to 207.

It is anticipated that belt 110 may have a size which is appropriate to the particular application. For example, a first belt may have a width of 6.00 inches and an overall length of 22.00 inches for use about a patient's head and a second belt may have a width of 2.75 inches and a length of 18.00 inches for use about a patient's neck, knee, or shoulder. In each case, the length of spacer pad 150 as well as the position of Velcro hooks and loops 160 and 170 is adjusted such that these elements perform their intended functions as described above.

In providing belts of several different but standard sizes as discussed above, it is advantageous to design them in such a manner that the diameter of the coil and the number of turns in the coil yields the same inductance. As discussed above in reference to equation (2), this will provide the same resonant frequency and advantageously enable an NMRI instrument to use a single tuning and preamplifier circuit for the entire set of belts.

Figure 3:
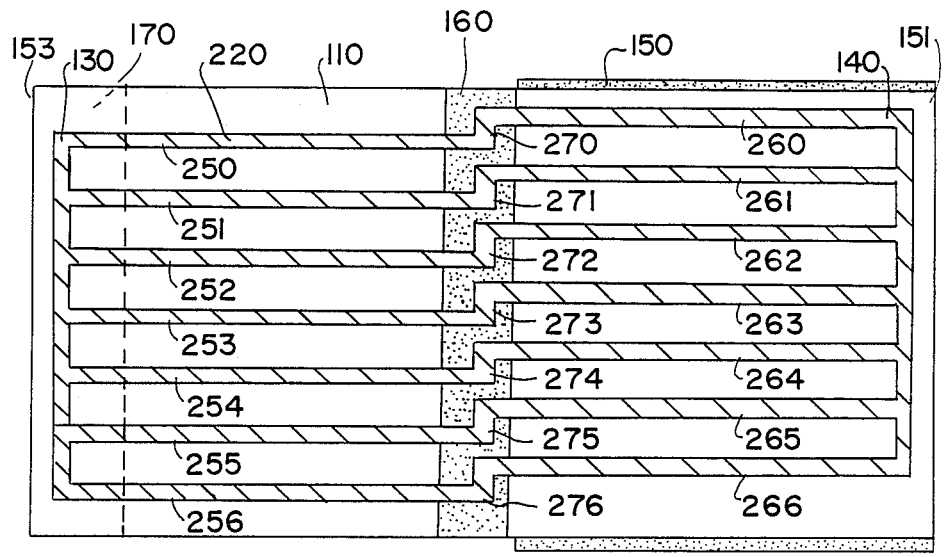
FIG. 3 shows a plan view of receiver in accordance with a second embodiment of the present invention.

FIG. 3 shows a second embodiment of the present invention generally designated as 200. Receiver 200 can be configured, in the manner shown in FIG. 2 for receiver 100, to form a receiver coil which closely conforms to a portion of a human body, such as, for example, a human head undergoing NMR imaging.

Receiver 200 includes belt 110 which is the same as belt 110 used for receiver 100. Belt 110 carries a flexible, electrical conductor generally designated as 220. As shown in FIG. 3, conductor 220 comprises three sections: (1) a first section formed from several, substantially parallel strips 260 to 266 which extend from end 151 of belt 110 to the central region of belt 110; (2) a second section formed from several connecting strips 270 to 276 which extend a relatively short distance from and at a relatively large angle with respect to strips 260 to 266; and (3) a third section formed from several, substantially parallel strips 250 to 256 which extend from the end of strips 270 to 276 to end 153 of belt 110 in a configuration which is substantially parallel to strips 260 to 266. As discussed above with respect to conductor 120, conductor 220 is formed from copper strips which are approximately 5 mils thick and approximately ¼" wide. Further, conductor 220 may be covered by a sleeve (not shown) or, in a further embodiment, carried within insulator belt 110. In fact, in preferred embodiments of the present invention, insulator belt 110 forms a sandwich-like structure with conductor 220 being disposed in the middle of the sandwich structure. A sandwich-like structure forms a preferred embodiment of belt 110 for same reason discussed above with respect to receiver 100.

As in the earlier embodiments, electrical conductive strips or leads 130 and 14 are connected to opposite ends of conductor 220 to connect the strips in parallel, a spacer pad 150 is affixed to belt 110, and affixing means 160 and 170 are affixed to belt 110 in the same manner and for the same reasons as discussed above with respect to receiver 100.

When receiver 200 is configured in the same manner in which receiver 100 is configured in FIG. 2 for use in conjunction with an NMRI instrument, conductor 220 forms a receiver coil having a plurality of non-overlapping turns which do not interfere with each other. Conductor 220 may be fabricated to have several off-set or staggered sections of a multiplicity of conductive strips so that when the belt is wrapped about an object so that it makes a multiplicity of non-overlapping turns therearound which do not interfere with each other.

Another embodiment of the present invention is directed to the discomfort often experienced by patients undergoing NMR examination, particularly when imaging of the human head is involved. To examine an individual's head, the receiver coil of the present invention must be conformed about the head and in close proximity thereto for the reasons discussed above. The close proximity of the receiver coil necessarily minimizes airflow rendering it difficult for the patient to breathe, and in addition, creates a claustrophobic effect which adds to the discomfort. Oftentimes, NMR scanning can take several tedious hours thus aggravating a discomfort caused by claustrophobia and lack of ventilation. In many cases the discomfort becomes unbearable for the patient and the NMR examination must be interrupted.

Figure 4:
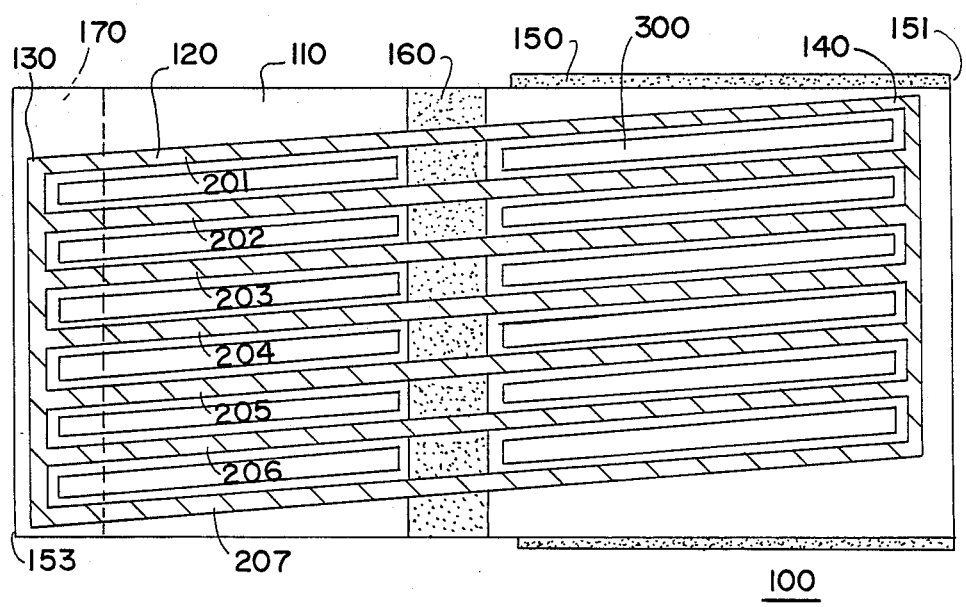
FIG. 4 shows a plan view of a receiver in accordance with a third embodiment of the present invention.

To alleviate such discomfort, the present embodiment of the invention herein provides vents to improve air ventilation and reduce the claustrophobic effect of the receiver coil. Thus, FIG. 4 shows the receiver coil of FIG. 1 which has been modified to provide air vents 300 between strips 201 to 207, these air vents 300 being disposed through the fiberglass insulator as well as the spacer foam pad 150. This construction enables the patient to have a free flow of air for breathing while reducing any claustrophobic effect he might otherwise experience with his head wrapped in the receiver coil.

Figure 5:
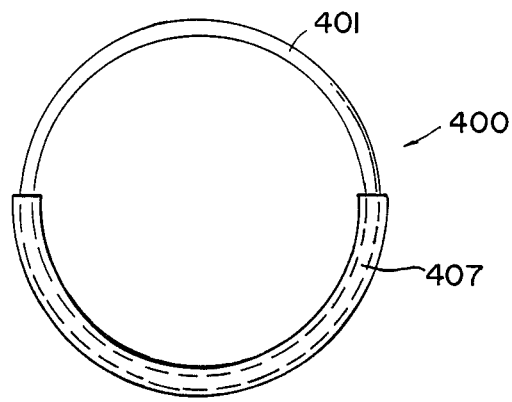
FIG. 5 is a front view of a receiver coil in accordance with a fourth embodiment of the present invention.
Figure 6:
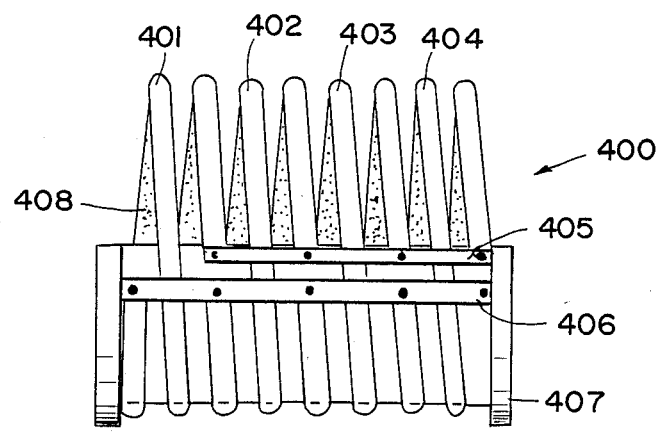
FIG. 6 is a left side view of the receiver coil shown in FIG. 6, illustrating in particular the connecting arrangement of the conductors.

A fourth embodiment of the present invention also serves to increase air ventilation and debilitate the claustrophobic effect of having a receiver coil disposed in close proximity to a patient's head. Referring now to FIGS. 5 and 6, a receiver coil adapted for receiving a patient's head is shown. The receiver coil in accordance with this embodiment of the present invention is generally designated as 400 and includes two turn conductor coils 401-404 which are connected, by solder or otherwise, in parallel by leads 405 and 406. Conductor coils 401-404 are preferably in the form of copper tubing, but of course can be of any conductive material and any configuration. An insulator 407 is provided on the lower half of receiver coil 400 so that a patient may rest the back of his head thereupon. The upper half of receiver coil 400 has no or very little insulation so as to permit the free flow of air between the coils. It is, however, preferable to provide foam pad 408 on the interior surfaces of coils 401-404 so that the optimum distance between these coils and patient's face can be obtained. In keeping with one of the objectives of the present invention, the coils 401-404 are deformable so that they may be shaped about the contour of the patient's face.

It is to be particularly noted that receiver coil 400 is comprised of several two-turn conductor coils. Two-turn coils have been determined to be the optimum number of turns for a relatively small coil which will surround a patient's head. This optimum number of turns for head coils was ascertained after balancing the fact that the more turns there are, the higher the voltage of the NMR signal is against the fact that the total length of winding must be negligible with respect to the wave length of the NMR signal. Thus, each conductor coil makes two full turns from lead 406 to lead 405 to form cylindrically shaped head coil 400.

As can be seen from FIGS. 1-6, a wide variety of belts and coil configurations can be devised. It is also anticipated that the present invention may be practiced by using a flexible printed circuit. Therefore, while the present invention has been described in connection with several exemplary embodiments thereof, it will be understood that many modifications will be readily apparent to those of ordinary skill in the art. This application and the following claims are intended to cover those modifications and variations.

What is claimed is:

1. A receiver antenna for an NMR imaging system, said receiver antenna comprising, an elongated, belt-like carrier member, said carrier member having a first end and a second end spaced apart from one another in a longitudinal dimension and a first side and a second side defining a lateral width, at least two electrical conductors connected in parallel, said at least two conductors being spacedly positioned across said lateral width in side-by-side relation and carried on said belt-like carrier member in the longitudinal direction thereof, said carrier member with said at least two electrical conductors being adapted to form a loop about a specimen.

2. A receiver antenna as claimed in claim 1, wherein said at least two conductors extend obliquely from said second end of said belt-like carrier member towards said second end of said belt-like carrier member.

3. A receiver antenna as claimed in claim 1, wherein each of said at least two electrical conductors includes a first section carried adjacent one end of said belt-like carrier member and a second section carried adjacent the opposite end of said belt-like carrier member, the second section of each said conductor being laterally offset from said first section of the same conductor.

4. A receiver antenna as claimed in claim 1, including spacer means for positioning said at least two electrical conductors at a substantially optimum distance from said specimen when said belt-like carrier member forms a loop thereabout.

5. A receiver antenna as claimed in claim 1, wherein said at least two electrical conductors are shapable about the contour of said specimen.

6. A receiver antenna as claimed in claim 2 or 3, wherein at least one void is provided in said carrier member between said at least two electrical conductors so as to provide air ventilation through said loop.

7. A receiver antenna as claimed in claim 1, wherein said belt-like carrier member is wrapped about itself one and one-half turns to form said loop about said specimen.

8. A receiver antenna as claimed in claim 1, wherein said belt-like carrier member is made of fiberglass.

9. A receiver antenna as claimed in claim 4, wherein said spacer means comprises a foam pad.

10. A receiver antenna as claimed in claim 1, wherein said at least two electrical conductors are made of copper.

11. A receiver antenna as claimed in claim 1, wherein said at least two electrical conductors are connected in parallel by two electrical conductive strips extending laterally at said first end and second end of said belt-like carrier member.

12. A receiver antenna as claimed in claim 1, including coupling means for connecting said at least two electrical conductors to a RF receiver apparatus.

13. A receiver antenna for an NMR imaging system, said receiver antenna comprising, a loop like structure defining a circumferential dimension and a lateral direction transverse to said circumferential direction, said loop-like structure including at least two electrical conductors connected in parallel, extending in said circumferential direction and being positioned in side by side relation spaced from one another in said lateral direction, said at least two electrical conductors defining an interior space for receiving a specimen.

14. A receiver antenna as claimed in claim 13, wherein each of said at least two electrical conductors makes two full turns about the circumference of said loop-like structure.

15. A receiver antenna as claimed in claim 13, wherein a void is provided between said at least two electrical conductors so as to provide air ventilation through said loop-like structure.

16. A receiver antenna as claimed in claim 13, wherein said loop-like structure includes an insulator provided on a portion of said loop-like structure.

17. A receiver antenna as claimed in claim 13, wherein said at least two electrical conductors are connected in parallel by two laterally extending conductive strips.

18. A receiver antenna as claimed in claim 13, further including coupling means for connecting said at least two electrical conductors to an RF receiver apparatus.

* * * * *

UNITED STATES PATENT AND TRADEMARK OFFICE
CERTIFICATE OF CORRECTION

PATENT NO. : 4,887,038

DATED : December 12, 1989

INVENTOR(S) : Jan Votruba and George R. Morris

It is certified that error appears in the above-identified patent and that said Letters Patent is hereby corrected as shown below:

Column 1, line 34, "ar" should read --are--
Column 1, line 46, "of" should read --for--
Column 2, line 67, after "view of" insert --a--
Column 3, line 63, "space" should read --spacer--
Column 4, line 63, "178" should read --1/2--
Column 6, line 7, "tray" should read --stray--
Column 8, line 37, "second" should read --first--

Signed and Sealed this

Nineteenth Day of March, 1991

Attest:

HARRY F. MANBECK, JR.

Attesting Officer     Commissioner of Patents and Trademarks